(12) United States Patent
Khan. P et al.

(10) Patent No.: US 10,897,252 B1
(45) Date of Patent: Jan. 19, 2021

(54) METHODS AND APPARATUS FOR AN AUXILIARY CHANNEL

(71) Applicant: SEMICONDUCTOR COMPONENTS INDUSTRIES, LLC, Phoenix, AZ (US)

(72) Inventors: Athar Ali Khan. P, Kanaka Nagar (IN); Rajiv Pandey, Bangalore (IN); Yogendri Ramsingh, Bengaluru (IN)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/675,967

(22) Filed: Nov. 6, 2019

Related U.S. Application Data

(60) Provisional application No. 62/905,957, filed on Sep. 25, 2019.

(51) Int. Cl.
 *H03K 17/00* (2006.01)
 *H03K 17/693* (2006.01)
 *H03K 17/687* (2006.01)

(52) U.S. Cl.
 CPC ....... *H03K 17/693* (2013.01); *H03K 17/6872* (2013.01)

(58) Field of Classification Search
 CPC .................. H03K 17/693; H03K 17/6872
 USPC .......................................... 327/408
 See application file for complete search history.

(56) References Cited

U.S. PATENT DOCUMENTS

| | | | |
|---|---|---|---|
| 7,012,458 B1 * | 3/2006 | Roo | H03K 17/693 327/404 |
| 8,674,223 B2 | 3/2014 | Horan | |
| 9,612,647 B2 | 4/2017 | Gopal | |
| 10,353,853 B1 * | 7/2019 | Khamesra | G06F 13/362 |
| 10,381,787 B1 * | 8/2019 | Bodnaruk | H01R 24/60 |
| 2009/0179883 A1 * | 7/2009 | Goodart | G09G 5/006 345/211 |
| 2015/0097821 A1 | 4/2015 | Shi | |

* cited by examiner

*Primary Examiner* — Metasebia T Retebo
(74) *Attorney, Agent, or Firm* — The Noblitt Group, PLLC; Hettie L. Haines

(57) ABSTRACT

Various embodiments of the present technology may provide methods and apparatus for an auxiliary channel. The auxiliary channel may include a first PMOS transistor connected between two terminals of the auxiliary channel and a second PMOS transistor connected to one of the two terminals, via a resistor, at a first end and to a gate terminal of the first PMOS. The auxiliary channel may further include a support circuit connected to the gate terminals of both the first and second PMOS transistors.

19 Claims, 4 Drawing Sheets

METHODS AND APPARATUS FOR AN AUXILIARY CHANNEL

CROSS-REFERENCE TO RELATED APPLICATIONS

This application claims the benefit of U.S. Provisional Patent Application No. 62/905,957, filed on Sep. 25, 2019, the entire contents of which is incorporated herein by reference.

BACKGROUND OF THE TECHNOLOGY

Many electrical systems utilize an interface to transmit data between a host device and a sink device. In some applications, such as in a DisplayPort (DP) application, the interface may include an auxiliary channel to transmit device management and device control data, such as "handshake" signals, between a DP transmitter and a DP receiver.

Conventional systems require that a charge pump be ON to power-down (create a high impedance condition) the auxiliary channel. This requirement, however, increases the power consumed by the charge pump. In mobile applications, where extended battery life is desired, the power consumed by the charge pump to power-down the auxiliary channel reduces the life of the battery.

SUMMARY OF THE INVENTION

Various embodiments of the present technology may provide methods and apparatus for an auxiliary channel. The auxiliary channel may include a first PMOS transistor connected between two terminals of the auxiliary channel and a second PMOS transistor connected to one of the two terminals via a resistor at a first end and to a gate terminal of the first PMOS transistor at a second end. The auxiliary channel may further include a support circuit connected to the gate terminals of both the first and second PMOS transistors.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

Figure 1:
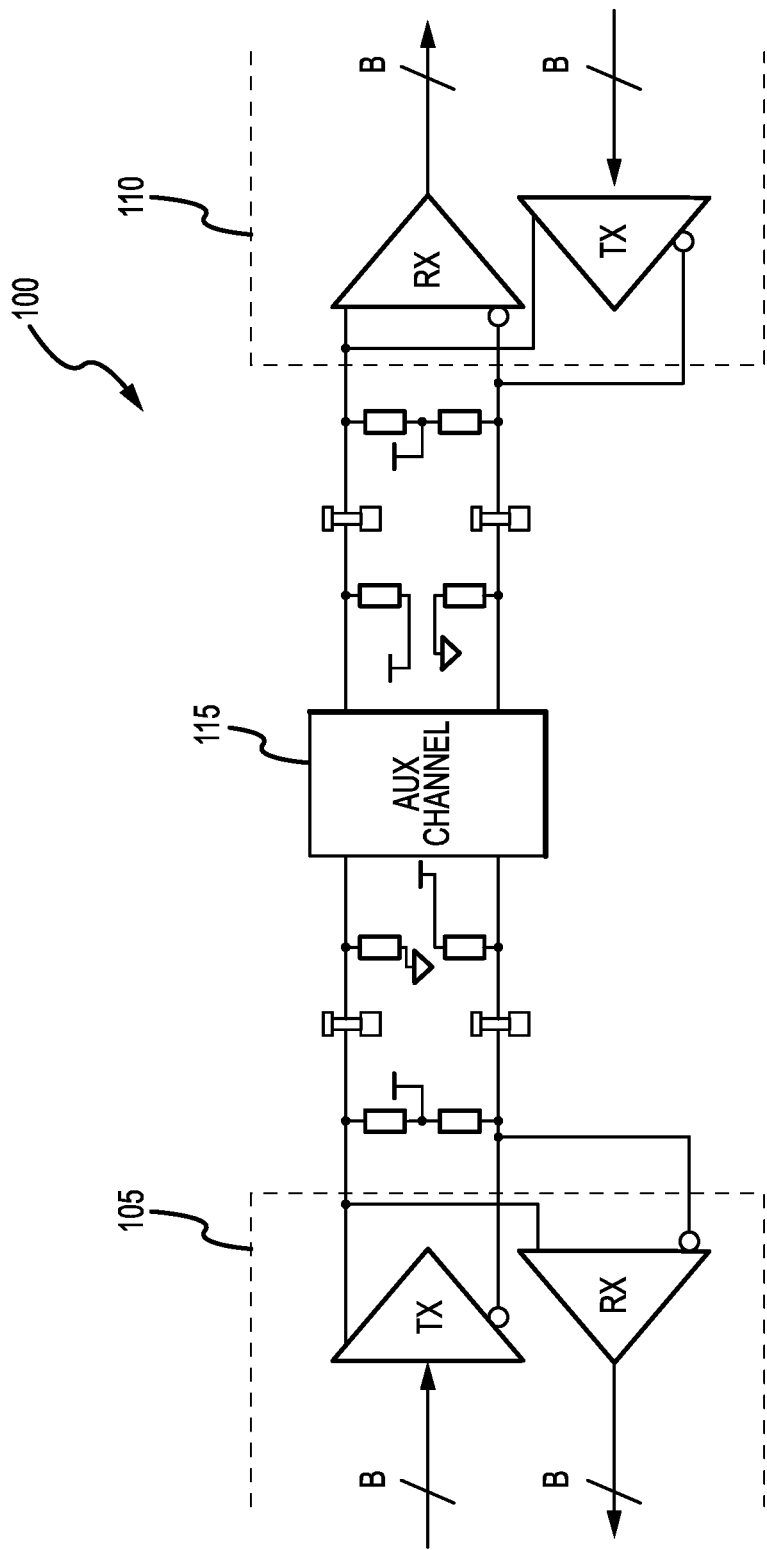
FIG. 1 is a block diagram of a system in accordance with an exemplary embodiment of the present technology.

The present technology may be described in terms of functional block components and various processing steps. Such functional blocks may be realized by any number of components configured to perform the specified functions and achieve the various results. For example, the present technology may employ various level shifters, charge pumps, amplifiers, transistors, resistive elements, switching devices, receivers, transmitters, and the like, which may carry out a variety of functions. In addition, the present technology may be practiced in conjunction with any number of electronic systems, such as automotive, aviation, "smart devices," portables, and consumer electronics, and the systems described are merely exemplary applications for the technology.

Methods and apparatus for an auxiliary channel according to various aspects of the present technology may operate in conjunction with any suitable communication system. For example, and referring to FIG. 1, an exemplary system 100 may comprise a host device 105 (i.e., a source device), an auxiliary channel 115 (i.e., an interface), and a sink device 110 (e.g., a computer monitor or display screen). Both the host device 105 and the sink device 110 may comprise a transmitter TX and a receiver RX.

According to an exemplary embodiment, the host device 105 and the auxiliary channel 115 may be connected by transmission lines and coupling capacitors. Similarly, the auxiliary channel 115 and the sink device 110 may be connected by transmission lines and coupling capacitors. Accordingly, the host device 105 and the sink device 110 are connected to and communicate with each other via the auxiliary channel 115, transmission lines, and coupling capacitors. The transmission lines may comprise any suitable communication lines, buses, links, wires, cables, and the like for transferring data. In addition, various resistive devices (e.g., resistors) may be connected to the transmission lines to provide DC biasing.

The auxiliary channel 115 may provide high-speed communication (data transmission) at various voltages, such as at high and low voltages, across the auxiliary channel 115. In one embodiment, the auxiliary channel 115 may be configured to perform at 1.8 volts for data rates of 1 Mbps (Megabits per second). In other embodiments, the auxiliary channel 115 may be configured to perform at any desired supply voltage level and any data rate.

In various embodiments, the auxiliary channel 115 may be configured as a uni-directional channel or a bi-directional channel. For example, the auxiliary channel 115 may transmit data in one direction (e.g., from the host device 105 to the sink device 110) or may transmit data in both directions (e.g., from the host device 105 to the sink device 110 and from the sink device 110 to the host device 105). The auxiliary channel 115 may have any desired architecture, such as a differential architecture or a single-ended architecture.

Figure 2:
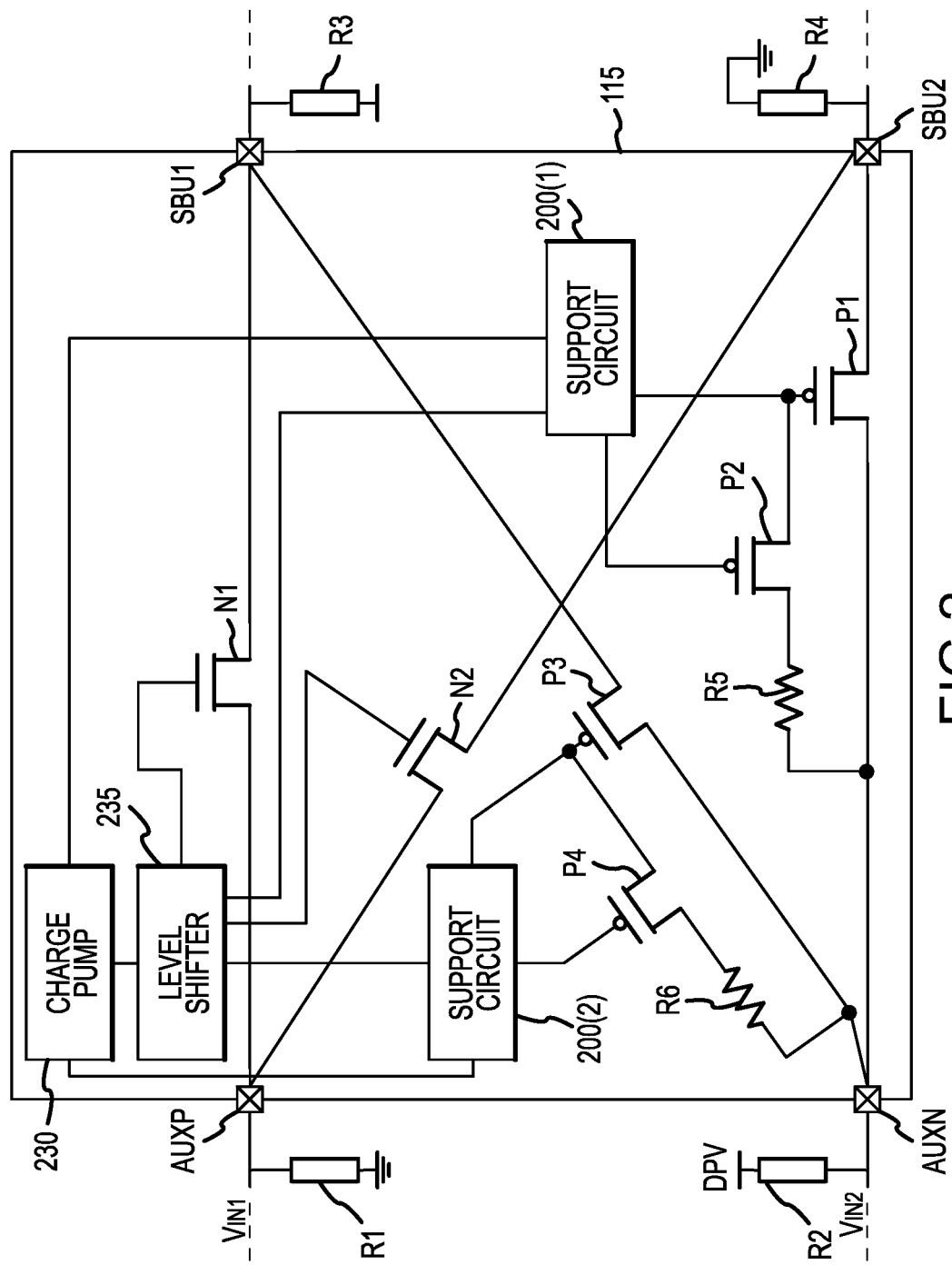
FIG. 2 is a simplified circuit diagram of an auxiliary channel in accordance with an exemplary embodiment of the present technology.
Figure 3:
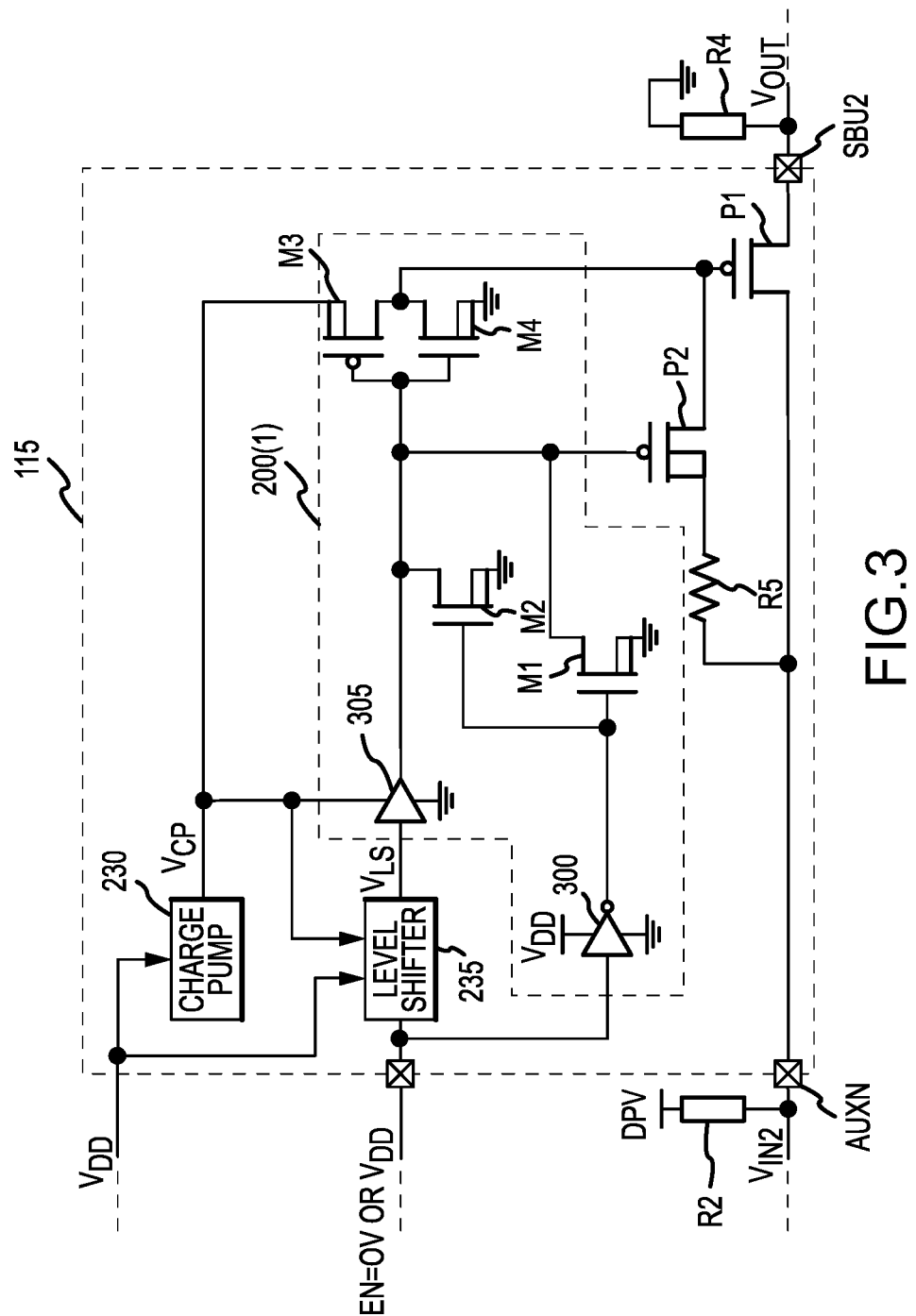
FIG. 3 is a simplified circuit diagram of the auxiliary channel in accordance with an exemplary embodiment of the present technology.

In an exemplary embodiment, and referring to FIGS. 1-3, the auxiliary channel 115 may comprise a first pair of I/O pads, such as a first I/O pad AUXP and a second I/O pad AUXN, connected to the host device 105 to achieve signal transmission between the host device 105 and the auxiliary channel 115. In addition, the auxiliary channel 115 may further comprise a second pair of I/O pads, such as such as a third I/O pad SBU1 and a fourth I/O pad SBU2, connected to the sink device 110 to achieve signal transmission between the sink device 110 and the auxiliary channel 115. The first I/O pad AUXP may receive a first input signal $V_{IN1}$, which may have a common-mode voltage of approximately 0 volts, the second I/O pad AUXN may receive a second input signal $V_{IN2}$, which may have a common-mode voltage that is approximately equal to a display port voltage DPV, and the third and fourth I/O pads SBU1, SBU2 may generate an output signal $V_{OUT}$.

In an exemplary embodiment, and referring to FIGS. 2 and 3, the auxiliary channel 115 may operate as a multiplexer (MUX) that may be turned ON and OFF at desired times. For example, the auxiliary channel 115 may comprise a plurality of switching devices arranged between various I/O pads. In an exemplary embodiment, the auxiliary channel 115 may comprise a first switch N1 connected between the first I/O pad AUXP and the third I/O pad SBU1, a second switch N2 connected between the first I/O pad AUXP and the fourth I/O pad SBU2, a third switch P1 connected between the second I/O pad AUXN and the fourth I/O pad SBU2, and a fourth switch P3 connected between the second I/O pad AUXN and the third I/O pad SBU1. Each switching device N1, N2, P1, P3 may comprise any device and/or circuit suitable for controlling current flow, such as a bipolar junction transistor, a metal-oxide-semiconductor transistor, and the like.

In an exemplary embodiment, the first switch N1 may comprise a NMOS transistor, the second switch may comprise a NMOS transistor, the third switch P1 may comprise a PMOS transistor, and the fourth switch P3 may comprise a PMOS transistor. Each transistor may comprise three terminals, such as a gate terminal and two source/drain terminals.

In addition, the auxiliary channel 115 may comprise a fifth switch P2 connected in series with a fifth resistor R5. The fifth switch P2 may comprise a PMOS transistor comprising a gate terminal and two source/drain terminals. A first end of the fifth resistor R5 may be connected to the second I/O pad AUXN, and a source/drain terminal of the fifth switch P2 may be connected to the gate terminal of the third switch P1.

In addition, the auxiliary channel 115 may comprise a sixth switch P4 connected in series with a sixth resistor R6. The sixth switch P4 may comprise a PMOS transistor comprising a gate terminal and two source/drain terminals. A first end of the sixth resistor R6 may be connected to the second I/O pad AUXN, and a source/drain terminal of the sixth switch P4 may be connected to the gate terminal of the fourth switch P3.

According to various embodiments, the switching devices (e.g., N1, N2, P1, P2, P3, P4) may be selectively controlled (i.e., turned ON and OFF). In an exemplary embodiment, the auxiliary channel 115 may further comprise a voltage generator and a support circuit 200, such as a first support circuit 200(1) and a second support circuit 200(2), that operate together to provide a control signal to the switching devices. For example, and in a case where each switching device comprises a transistor, the control signal may be applied to a gate terminal of a particular switching device to control ON/OFF operation.

The voltage generator may be configured to generate one or more voltage levels according to a supply voltage $V_{DD}$ and an enable signal EN to control operation of the support circuit 200 and/or the switches N1, N2, P1, P2, P3, P4. In an exemplary embodiment, the voltage generator may comprise a charge pump 230 and a level shifter 235. In other embodiments, however, the voltage generator may comprise any circuit and/or system suitable for generating desired voltages, signals, currents, and the like to control operation of the auxiliary channel 115.

The charge pump 230 may be configured to convert and/or regulate the supply voltage $V_{DD}$ and generate a charge pump voltage $V_{CP}$ based on the supply voltage $V_{DD}$. For example, the charge pump 230 may utilize switching technology and capacitive-energy storage elements to achieve a desired DC output voltage. The charge pump 230 may comprise any circuit and/or system suitable for generating one or more DC output voltages based on the supply voltage $V_{DD}$. According to an exemplary embodiment, the charge pump 230 may supply the DC output voltage to the level shifter 235 and the first and second support circuits 200(1), 200(2).

The level shifter 235 may be configured to translate signals from one domain to another. The level shifter 235 may comprise a digital logic circuit and/or various logic devices and logic gates. In an exemplary embodiment, the level shifter 235 may be configured to receive the charge pump voltage $V_{CP}$ from the charge pump 230 and generate a corresponding output $V_{LS}$ (i.e., a level shifter output $V_{LS}$). In an exemplary embodiment, the level shift output $V_{LS}$ may comprise a digital value. In addition, the level shifter 235 may be connected receive the enable signal EN, wherein the enable signal may be zero volts or the supply voltage $V_{DD}$ (i.e., EN=0V or EN=$V_{DD}$). The level shifter 235 may supply the digital value ($V_{LS}$) to the support circuit 200.

The first and second support circuits 200(1), 200(2) may be configured to ensure that switches P1, P2, P3, and P4 operate as desired and/or make use of externally defined voltages high common mode potentials and the operating supply voltage (e.g. 1.8V) to define various undefined control signal voltages to achieve low power-down current. In other words, the support circuits 200 ensure that the switches P1, P2, P3, and P4 enter a true high impedance state to effectively power-down the auxiliary channel 115. According to an exemplary embodiment, the first support circuit 200(1) may be connected to the third and fourth switches P1, P2. Similarly, the second support circuit 200(2) may be connected to the fifth and sixth switches P3, P4.

In an exemplary embodiment, each support circuit 200(1), 200(2) may comprise a plurality of transistors, such as transistors M1, M2, M3, and M4, wherein each transistor comprises a gate terminal and two source/drain terminals. In an exemplary embodiment, transistors M1, M2, and M4 may comprise NMOS transistors, while transistor M3 may comprise a PMOS transistor. Each support circuit 200 may further comprise an inverter 300 and a buffer 305. The inverter 300 may operate according to the supply voltage $V_{DD}$ and may operate to invert the enable signal EN. The buffer 305 may operate according to the charge pump voltage $V_{CP}$ and transmit the level shifter output $V_{LS}$ to transistors M3 and M4.

The gates of transistors M1 and M2 may be connected to an output terminal of the inverter 300. One source/drain terminal of transistor M1 may be connected to the gate terminal of the fourth switch P2, and the remaining source/drain terminal of the transistor M1 may be connected to a ground potential. One source/drain terminal of transistor M2 may be connected to an output terminal of the buffer 305 and gate terminals of transistors M3 and M4, and the remaining source/drain terminal of the transistor M2 may be connected to the ground potential.

Together, transistors M3 and M4 may form an inverter comprising an input and an output. For example, transistors M3 and M4 may be connected in series with each other and the gate terminals of transistors M3 and M4 may be connected to each other. One source/drain terminal of transistor M3 may be connected to the charge pump 230 and receive the charge pump voltage $V_{CP}$. One source/drain terminal of transistor M4 may be connected to the ground potential. The output of transistors M3 and M4 may be connected to the gate terminal of the third switch P1.

In alternative embodiments, each support circuit 200 may comprise any number of transistors, resistors, inverters, buffers, logic gates, and the like, in any configuration suitable for defining internal control signals and/or ensuring that switches, such as a P1, P2, P3, and P4, are in a true high impedance state (OFF).

In an exemplary embodiment, the system 100 may further comprise external resistors, such as resistors R1, R2, R3 and R4, connected to the auxiliary channel 115. Resistors R1 and R2 may be connected to the auxiliary channel 115 to define a DC common mode voltage at the first and second I/O pads AUXP, AUXN. In an exemplary embodiment, resistors R1 and R2 may each have a resistance value in the range of 10 k-ohms to 105 k-ohms. Resistors R3 and R4 may be connected to the third and fourth I/O pads SBU1, SBU2 and each may have a resistance value of 1 M-ohm.

The auxiliary channel 115 may receive the display port voltage DPV that is defined by the particular protocol and may be in range of 2.89 V to 3.6 V (or 3.3 V+/−10%), and have an input differential signal swing in the range of 270 mV to 1.4 V (peak-to-peak). Accordingly, the potential at the first I/O pad AUXP may range from 0 V to 0.3 V and the potential at the second I/O pad AUXN may range from 2.89 V to 3.6 V.

Referring to FIG. 2, the auxiliary channel 115 may operate according to a forward path or a cross path. In the forward path operation, switches N1, P1, and P2 are turned ON (ACTIVE) and switches N2, P3, and P4 are OFF (IN-ACTIVE). In the cross path operation, switches N1, P1, and P2 are turned OFF (IN-ACTIVE) and switches N2, P3, and P4 are ON (ACTIVE). The cross path may be enabled by the host device 105 or the sink device 110 when the DP channels are inverted.

Figure 4:
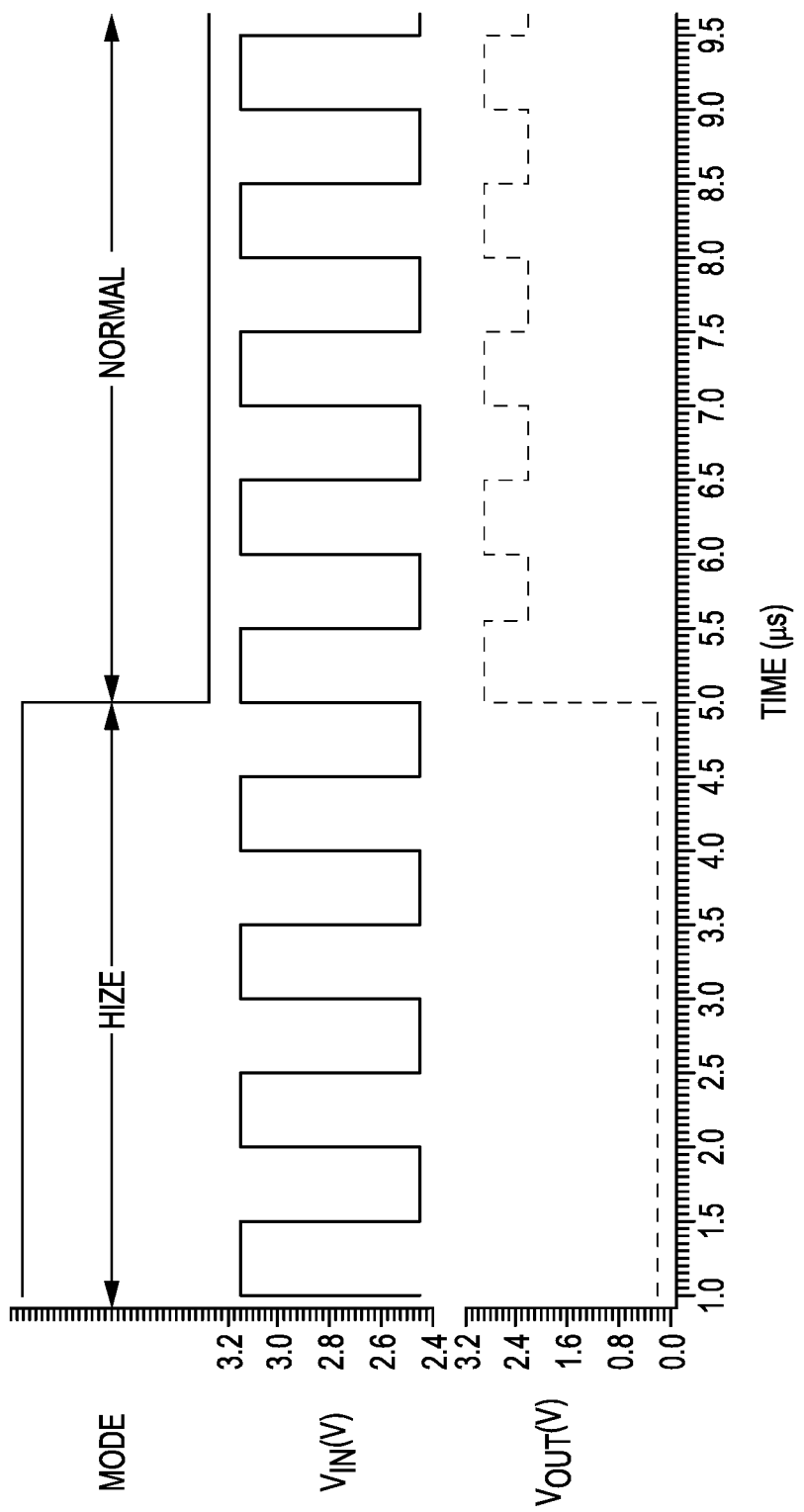
FIG. 4 is a timing diagram of the auxiliary channel in accordance with an exemplary embodiment of the present technology.

In addition, and referring to FIGS. 3 and 4, the auxiliary channel 115 may operate in a normal mode or a high impedance mode (HIZE) (to power-down the auxiliary channel 115). During the normal mode, the charge pump 230 is ON and may generate a charge pump voltage $V_{CP}$ of 3.6 V, the third switch P1 is ON, the fourth switch P2 is OFF, transistors M1, M2, and M3 are OFF, and the second I/O pad AUXN may receive an input voltage VIN of 3.6 V. Since the fourth switch P2 is OFF, it does not interfere with the normal mode functionality in the MUX function of the auxiliary channel 115.

During the high impedance mode (power-down), the charge pump 230 is OFF, the third switch P1 is OFF, the fourth switch P2 is ON, and the second I/O pad AUXN may receive a second input voltage $V_{IN2}$ of approximately 3.6 V. In addition, the support circuit 200 operates to define internal control signal voltages of the auxiliary channel 115 and ensure that the third switch P1 is OFF. For example, the charge pump voltage $V_{CP}$ will have a common mode voltage of 3.6 V, transistors M1, M2, and M3 are ON and transistor M3 will have a common mode voltage of 3.6 V, which turns the fourth switch P2 ON. The fourth transistor P2 is therefore able to transfer the DC input common mode potential of the second I/O pad AUXN to the gate of the third switch P1, thereby making the third switch P1 enter a true high impedance state.

In addition, since the charge pump 230 is OFF during power-down, the charge pump 230 does not consume power-down current. In battery-powered applications, this may extend the life of the battery.

In the cross path operation, the fifth and sixth switches P3, P4 may operate in the normal and high impedance modes, as described above, and in conjunction with the second support circuit 200(2). In addition, the second support circuit 200(2) may be identical to and operate in the same manner as the first support circuit 200(1), as described above, to control the fifth and sixth switches P3, P4 during cross path operation.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An auxiliary channel, comprising:
    a first set of I/O pads, comprising a first I/O pad and a second I/O pad;

a second set of I/O pads, comprising a third I/O pad and a fourth I/O pad;
a first switch device comprising a first terminal, a second terminal, and a third terminal, wherein the first terminal is connected to the second I/O pad, the second terminal is connected to the fourth I/O pad;
a second switch device comprising a fourth terminal, a fifth terminal and a sixth terminal; wherein the fourth terminal is connected to the second I/O pad, the fifth terminal is connected to the third terminal; and
a circuit connected to:
the first switch device via the third terminal; and
the second switch device via the sixth terminal.

2. The auxiliary channel according to claim 1, further comprising a resistor connected between the second I/O pad and the fourth terminal.

3. The auxiliary channel according to claim 1, wherein the circuit is configured to define an internal voltage of the auxiliary channel.

4. The auxiliary channel according to claim 1, wherein the circuit comprises a plurality of transistors, comprising:
a first transistor comprising a first gate terminal, wherein the first transistor is connected to the sixth terminal and configured to receive an enable signal at the first gate terminal; and
a second transistor comprising a second gate terminal, wherein the second transistor is connected to the sixth terminal and configured to receive the enable signal at a second gate terminal.

5. The auxiliary channel according to claim 4, wherein the circuit further comprises an inverter circuit comprising:
a third transistor and a fourth transistor connected in series;
an input terminal; and
an output terminal;
wherein the input terminal is connected to the second switch device and the output terminal is connected to the third terminal of the first switch device.

6. The auxiliary channel according to claim 5, wherein:
each of the first and second transistors comprise a NMOS transistor; and
the third transistor comprises a PMOS transistor.

7. The auxiliary channel according to claim 1, wherein each of the first and second switch devices comprise a PMOS transistor.

8. The auxiliary channel according to claim 1, further comprising a charge pump comprising an input terminal and an output terminal, wherein the input terminal is connected to a supply voltage and the output terminal is connected to the circuit.

9. The auxiliary channel according to claim 8, further comprising a level shifter connected to the output terminal of the charge pump, an enable signal, and the circuit.

10. The auxiliary channel according to claim 1, further comprising:
a third switch device comprising a seventh terminal, an eighth terminal, and a ninth terminal; wherein the seventh terminal is connected to the second I/O pad, the eighth terminal is connected to the third I/O pad; and
a fourth switch device comprising a tenth terminal and an eleventh terminal wherein the tenth terminal is connected to the second I/O pad, the eleventh terminal is connected to the ninth terminal of the third switch device.

11. A method for operating an auxiliary channel having an input pad, an output pad, a charge pump and a plurality of switches, comprising:
operating the auxiliary channel in a normal mode, wherein:
the charge pump is ON;
a first switch, from the plurality of switches, connected between the input pad and the output pad, is ON; and
a second switch, from the plurality of switches, connected to the input pad and the first switch, is OFF; and
operating the auxiliary channel in a high impedance mode, wherein:
the charge pump is OFF;
the first switch is OFF; and
the second switch is ON.

12. The method according to claim 11, wherein the auxiliary channel further comprises a circuit connected to the first and second switches and comprising:
a first transistor connected to the second switch, wherein the first transistor is:
OFF during the normal mode; and
ON during the high impedance mode.

13. The method according to claim 12, wherein the circuit further comprises a second transistor and a third transistor, wherein:
the second transistor is:
connected to the first transistor, the second switch, and the third transistor;
OFF during the normal mode; and
ON during the high impedance mode; and
the third transistor is:
connected to the charge pump and the first switch;
OFF during the normal mode; and
ON during the high impedance mode.

14. A system, comprising:
a host device connected to a sink device via an auxiliary channel, wherein the auxiliary channel comprises:
a first set of I/O pads, connected to the host device, comprising: a first I/O pad and a second I/O pad;
a second set of I/O pads, connected to the sink device, comprising: a third I/O pad and a fourth I/O pad;
a plurality of switch devices connected to at least one the first and second I/O pads, wherein each switch device from the plurality of switch devices is selectively operable to drive the auxiliary channel into a high impedance mode; wherein the plurality of switch devices comprises:
a first switch device connected between the second I/O pad and the fourth I/O pad;
a second switch device connected to the second I/O pad and the first switch device;
a third switch device connected between the second I/O pad and the third I/O pad; and
a fourth switch device connected to the second I/O pad and the third switch device; and
a plurality of support circuits connected to at least one of the switch devices from the plurality of switch devices and configured to define an internal voltage of the auxiliary channel when the auxiliary channel is in the high impedance mode.

15. The system according to claim 14, wherein each of the first, second, third, and fourth switch devices comprise a PMOS transistor.

16. The system according to claim 14, further comprising: a first resistor connected between the second I/O pad and the second switch device; and a second resistor connected between the second I/O pad and the fourth switch device.

17. The system according to claim 14, wherein the plurality of support circuits comprises: a first circuit connected to the first and second switch devices; and a second circuit connected to the third and fourth switch devices.

18. The system according to claim 17, wherein:
the first circuit comprises:
   a first NMOS transistor connected to the supply voltage and the second switch device;
   a second NMOS transistor connected to the supply voltage and the second switch device; and
   a third PMOS transistor connected in series with a fourth NMOS transistor, wherein the third and fourth transistors are connected to the second NMOS transistor and the first switch device; and
the second circuit comprises:
   a fifth NMOS transistor connected to the supply voltage and the fourth switch device;
   a sixth NMOS transistor connected to the supply voltage and the fourth switch device; and
   a seventh PMOS transistor connected in series with a eighth NMOS transistor, wherein the seventh and eight transistors are connected to the third switch device.

19. The system according to claim 14, further comprising a charge pump connected to the plurality of support circuits, wherein the charge pump is OFF during the high impedance mode.

* * * * *